(12) United States Patent
Kabansky et al.

(10) Patent No.: US 10,825,680 B2
(45) Date of Patent: Nov. 3, 2020

(54) DIRECTIONAL DEPOSITION ON PATTERNED STRUCTURES

(71) Applicant: Lam Research Corporation, Fremont, CA (US)

(72) Inventors: Alexander Kabansky, Santa Clara, CA (US); Samantha Tan, Fremont, CA (US); Jeffrey Marks, Saratoga, CA (US); Yang Pan, Los Altos, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/952,634

(22) Filed: Apr. 13, 2018

(65) Prior Publication Data

US 2018/0233357 A1 Aug. 16, 2018

Related U.S. Application Data (63) Continuation of application No. 15/061,359, filed on Mar. 4, 2016, now abandoned.
(Continued)

(51) Int. Cl.
*C23C 18/24* (2006.01)
*C23C 18/32* (2006.01)
(Continued)

(52) U.S. Cl.
CPC ...... *H01L 21/02274* (2013.01); *C23C 16/045* (2013.01); *C23C 16/24* (2013.01);
(Continued)

(58) Field of Classification Search
CPC ........... H01L 21/02274; H01L 21/0332; H01L 21/32055; H01L 21/0335; H01L 21/3081;
(Continued)

(56) References Cited

U.S. PATENT DOCUMENTS 7,901,736 B2 * 3/2011 Maula ................. C03C 17/3417
427/248.1
8,637,411 B2 1/2014 Swaminathan et al.
(Continued)

FOREIGN PATENT DOCUMENTS

CN 102844856 A 12/2012
JP 2007-281181 10/2007

OTHER PUBLICATIONS

Gordon et al. ("A Kinetic Model for Step Coverage by Atomic Layer Deposition in Narrow Holes or Trenches", Chem. Vap. Deposition 2003,9,No. 2 (pp. 73-78)) (Year: 2003).*
(Continued)

*Primary Examiner* — Duy Vu N Deo
*Assistant Examiner* — Mahmoud Dahimene
(74) *Attorney, Agent, or Firm* — Weaver Austin Villeneuve & Sampson LLP (57) ABSTRACT

Provided herein are methods and related apparatus that facilitate patterning by performing highly non-conformal (directional) deposition on patterned structures. The methods involve depositing films on a patterned structure, such as a hard mask. The deposition may be both substrate-selective such that the films have high etch selectivity with respect to an underlying material to be etched and pattern-selective such that the films are directionally deposited to replicate the pattern of the patterned structure. In some embodiments, the deposition is performed in the same chamber as a subsequent etch is performed. In some embodiments, the deposition may be performed in a separate chamber (e.g., a PECVD deposition chamber) that is connected to the etch chamber by a vacuum transfer chamber. The deposition may be performed prior to or at selected intermittences during at etch process. In some embodiments, the deposition involves multiple cycles of a deposition and treatment process.

21 Claims, 9 Drawing Sheets

Related U.S. Application Data (60) Provisional application No. 62/269,696, filed on Dec. 18, 2015.

(51) Int. Cl.

| | | |
|---|---|---|
| *C25D 5/56* | (2006.01) | |
| *H01L 21/02* | (2006.01) | |
| *H01L 21/033* | (2006.01) | |
| *H01L 21/3205* | (2006.01) | |
| *H01L 21/308* | (2006.01) | |
| *C23C 16/04* | (2006.01) | |
| *C23C 16/24* | (2006.01) | |
| *H01J 37/32* | (2006.01) | |

(52) U.S. Cl.
CPC ............ *H01J 37/32* (2013.01); *H01J 37/321* (2013.01); *H01J 37/32422* (2013.01); *H01J 37/32651* (2013.01); *H01L 21/02211* (2013.01); *H01L 21/02252* (2013.01); *H01L 21/0332* (2013.01); *H01L 21/0335* (2013.01); *H01L 21/0337* (2013.01); *H01L 21/3081* (2013.01); *H01L 21/32055* (2013.01); *H01L 2224/11474* (2013.01)

(58) Field of Classification Search
CPC ........... H01L 21/0337; H01L 21/02211; H01L 21/02252; H01L 2224/11474; H01J 37/32651; H01J 37/321; H01J 37/32422; H01J 37/32; C23C 16/24; C23C 16/045
See application file for complete search history.

(56) References Cited

U.S. PATENT DOCUMENTS

| | | | |
|---|---|---|---|
| 8,722,543 | B2 | 5/2014 | Belen et al. |
| 8,728,956 | B2 | 5/2014 | LaVoie et al. |
| 9,034,748 | B2 | 3/2015 | Baiocco et al. |
| 9,214,333 | B1 | 12/2015 | Sims et al. |
| 9,922,839 | B2 | 3/2018 | Wise et al. |
| 10,062,602 | B2 | 8/2018 | Posseme et al. |
| 10,438,807 | B2 | 10/2019 | Wise et al. |
| 2003/0211752 | A1 | 11/2003 | Rattner et al. |
| 2005/0170104 | A1 | 8/2005 | Jung et al. |
| 2006/0205220 | A1 | 9/2006 | Hudson et al. |
| 2009/0075490 | A1 | 3/2009 | Dussarrat |
| 2009/0163041 | A1 | 6/2009 | Mungekar et al. |
| 2009/0275202 | A1 | 11/2009 | Tanaka et al. |
| 2009/0286400 | A1 | 11/2009 | Heo et al. |
| 2011/0045672 | A1 | 2/2011 | Srinivasan et al. |
| 2011/0183528 | A1 | 7/2011 | Wang et al. |
| 2011/0207323 | A1* | 8/2011 | Ditizio ................ B81C 1/00087 438/675 |
| 2011/0256734 | A1 | 10/2011 | Hausmann et al. |
| 2014/0023794 | A1 | 1/2014 | Mahajani et al. |
| 2014/0120727 | A1* | 5/2014 | Subramanian .... H01L 21/32136 438/696 |
| 2014/0187035 | A1 | 7/2014 | Posseme et al. |
| 2014/0213060 | A1 | 7/2014 | Kao et al. |
| 2014/0273529 | A1 | 9/2014 | Nguyen et al. |
| 2015/0137061 | A1 | 5/2015 | Donghi et al. |
| 2016/0079054 | A1 | 3/2016 | Chen et al. |
| 2016/0093484 | A1 | 3/2016 | Marsh |
| 2016/0379824 | A1 | 12/2016 | Wise et al. |
| 2017/0178899 | A1 | 6/2017 | Kabansky et al. |
| 2018/0138405 | A1 | 5/2018 | McKerrow et al. |
| 2018/0190503 | A1 | 7/2018 | Wise et al. |

OTHER PUBLICATIONS

Non-Final Office Action dated Oct. 23, 2017, in U.S. Appl. No. 15/349,753.
Final Non-Final Office Action dated Apr. 20, 2018, in U.S. Appl. No. 15/349,753.
International Search Report and Written Opinion issued in Application No. PCT/US17/60240, dated Feb. 21, 2018.
U.S. Office Action, dated Dec. 11, 2018, issued in U.S. Appl. No. 15/909,814.
Chinese First Office Action, dated Aug. 27, 2019, issued in Application No. CN 201611177683.3.
U.S. Notice of Allowance, dated Jun. 13, 2019, 2018, issued in U.S. Appl. No. 15/909,814.
Taiwanese First Office Action dated Dec. 27, 2019 issued in Application No. TW 105119663.
Chinese Second Office Action dated Apr. 17, 2020 issued in Application No. CN 201611177683.3.
U.S. Office Action, dated Mar. 16, 2017, issued in U.S. Appl. No. 15/189,317.
U.S. Final Office Action, dated Aug. 24, 2017, issued in U.S. Appl. No. 15/189,317.
U.S. Notice of Allowance, dated Nov. 9, 2017, issued in U.S. Appl. No. 15/189,317.
U.S. Office Action, dated Oct. 21, 2016, issued in U.S. Appl. No. 15/061,359.
U.S. Final Office Action, dated Mar. 13, 2017, issued in U.S. Appl. No. 15/061,359.
U.S. Office Action, dated Jul. 19, 2017, issued in U.S. Appl. No. 15/061,359.
U.S. Final Office Action, dated Dec. 13, 2017, issued in U.S. Appl. No. 15/061,359.
Petrillo et al., (2013) "Resist process applications to improve EUV patterning," Proc. of SPIE, 8679:867911-1 to 867911-12.
U.S. Appl. No. 15/909,814, filed Mar. 1, 2018, Wise et al.
Taiwanese First Office Action dated Jun. 18, 2020 issued in Application No. TW 105141672.

* cited by examiner

DIRECTIONAL DEPOSITION ON PATTERNED STRUCTURES

CROSS-REFERENCE TO RELATED APPLICATION

This application is a continuation of and claims priority to U.S. application Ser. No. 15/061,359, filed Mar. 4, 2016, which claims priority under 35 USC § 119(e) to U.S. Provisional Application No. 62/269,696, filed Dec. 18, 2015, each of which is incorporated herein by reference in its entirety and for all purposes.

BACKGROUND

In the scaling of 3D-NAND and DRAM, up to 64 pairs of ONON/OPOP are being used for channel holes. One of the key challenges in etching these high aspect ratio holes is mask loss during etch. Typical mask selectivity is in the range of 5-8 times that of etch, which translates to mask height needed in the range of 0.5 to 2 microns depending on depth of the holes. Taller masks increase the aspect ratios of the holes, increasing the difficulty of etching. Progressively higher plasmas densities and ion energies used to etch these high aspect ratio holes reduce the efficacy of conventional practices of slowing down mask erosion by non-selective deposition of fluorocarbon-based polymers during the etch.

SUMMARY

Provided herein are methods and apparatus for directional deposition on patterned structures. In some implementations, the methods involve performing a multi-cycle directional deposition process to deposit a mask-built up material on a patterned structure. Each cycle may include (i) depositing by a plasma enhanced chemical vapor deposition (PECVD) process a first material on the patterned structure, and (ii) plasma treating the first material to improve directionality.

According to various embodiments, the first material may be a silicon-based material, a carbon-based material, a boron-based material or a combination thereof. In some embodiments, the first material includes two or more of silicon, carbon, boron, phosphorous, arsenic and sulfur. In some embodiments, the first material is a metal-containing material. In some embodiments, the plasma treatment includes exposing the first material to a nitrogen-based plasma, an oxygen-based plasma, a hydrogen-based plasma, a hydrocarbon-based plasma, an argon-based plasma, a helium-based plasma, or a combination thereof.

In some embodiments, the method includes etching a layer masked by the patterned structure. The patterned structure may include raised features having features tops and feature sidewalls. In such embodiments, treating the first material may involve redepositing the first material from the feature sidewalls to the feature tops.

In some embodiments, each cycle involves reacting the first material to form a second material. In some embodiments, each cycle involves changing a material property of the first material. For example, the changing the material property of the first material may involve one or more of a plasma treatment, exposure to ultraviolet radiation, or a thermal anneal.

In some embodiments, depositing by the PECVD process includes introducing a silicon-containing precursor, a carbon-containing precursor, a boron-containing precursor, or a metal-containing precursor to a plasma reactor. In some embodiments, depositing by the PECVD process includes introducing a silicon-containing precursor selected from a silane, a halogenated silane, an organosilane, or an aminosilane.

In some embodiments, depositing by the PECVD process includes introducing a silicon-containing precursor selected from methylsilane, ethylsilane, isopropylsilane, t-butyl silane, dimethylsilane, diethyl silane, di-t-butylsilane, allylsilane, sec-butyl silane, thexylsilane, isoamylsilane, t-butyldisilane, di-t-butyldisilane, tetrachlorosilane, trichlorosilane, dichlorosilane, monochlorosilane, chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butyl silane, t-butyldimethylchlorosilane, thexyldimethylchlorosilane, mono-aminosilane, di-aminosilane, tri-aminosilane, tetra-aminosilane, t-butylaminosilane, methyl aminosilane, tert-butylsilanamine, bis(tertiarybutylamino)silane, or tert-butyl silylcarbamate.

In some embodiments, depositing by the PECVD process includes introducing a carbon-containing precursor selected from methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$).

In some embodiments, depositing by the PECVD process includes introducing a boron-containing precursor selected from borane ($BH_3$), diborane ($B_2H_6$), and triborane ($B_3H_7$).

In some embodiments, depositing by the PECVD process includes introducing a metal-containing precursor selected from pentakis(dimethylamido)tantalum, trimethylaluminum, tetraethoxytitanium, tetrakis-dimethyl-amido titanium, hafnium tetrakis(ethylmethylamide), bis(cyclopentadienyl) manganese, and bis(n-propylcyclopentadienyl)magnesium.

In some embodiments, one or both of the PECVD process and the plasma treating operation use an inductively-coupled plasma, or a capacitively-coupled plasma, or a microwave plasma. In some embodiments, one or both of the PECVD process and the plasma treating operation use a direct plasma, or a remote plasma, or a combination thereof. In some embodiments, one or both of the PECVD process and the plasma treating operation is an ion-assisted process, or radical-assisted process, or a combination thereof.

Also provides are apparatus for performing the methods disclosed herein. The apparatus may include one or more process chambers, such as an inductively coupled or capacitively-coupled etch chamber, and a controller having machine-readable instructions to perform the methods.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In semiconductor processing, masking methods are used to pattern and etch substrates. Mask loss during etch, also referred to as mask erosion, is a key challenge in etching high aspect ratio features such as holes and trenches. Provided herein are methods that involve depositing films on a mask or on a substrate pattern. The deposition may be both substrate-selective (such that the films have high etch selectivity with respect to the substrate) and pattern-selective (such that the films are directionally deposited on a pattern and replicate the pattern.) The deposited material is referred to as a mask build-up material. In some embodiments, the deposition is performed in the same chamber as the etching is performed, also referred to as in situ deposition. In some embodiments, the deposition may be performed in a separate chamber (e.g., a PECVD chamber or a different etch chamber) that is connected to the main etch chamber by a transfer chamber. It should be noted that although the description refers chiefly to deposition on patterned hard masks, the methods disclosed herein include directional deposition on any patterned structure to replicate the structure pattern.

Figure 1:
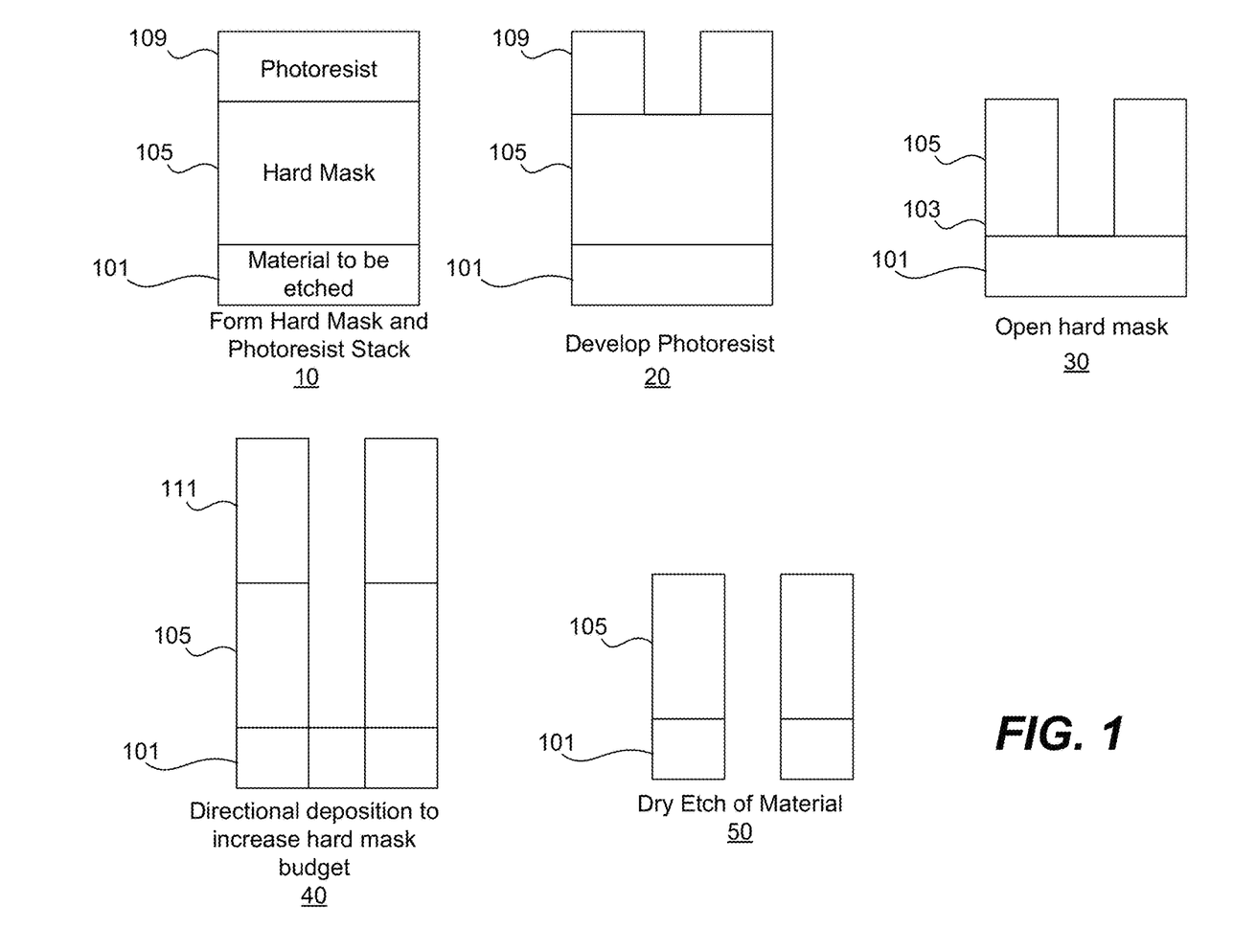
FIG. 1 illustrates operations of an example of an integration process that includes directional deposition on a hard mask.

The deposition of the mask build-up material may be performed prior to or at selected intermittences during etch process. FIG. 1 illustrates operations of an example of an integration process that includes directional deposition on a hard mask. In FIG. 1, at 10, a hard mask 105 and photoresist 109 is formed on a material 101 to be etched. The hard mask 105 may be any appropriate material including organic or inorganic hard masks. Examples of organic hard masks include doped or undoped amorphous carbon (also known as ashable hard masks or AHMs) and organo-siloxane materials. Examples of inorganic hard mask materials include poly- and amorphous silicon (poly-Si, a-Si), silicon oxide (SiO), silicon nitride (SiN), silicon oxynitrides (SiON), silicon carbonitride (SiCN), titanium nitride (TiN), tungsten (W) and other metal that can be selectively removed after feature etching. A hard mask may be doped, with an example being a boron-doped AHM. In some embodiments, the hard mask may be a metal hard mask (MHM), with examples including metals (e.g., aluminum (Al), metal nitrides (e.g., TiN and tantalum nitride (TaN), tungsten (W) and metal oxides (e.g., alumina ($Al_2O_3$)). In some embodiments, the hard mask may be a ceramic hard mask (CHM).

The process then proceeds with photoresist development (20) and hard mask open (30) to expose the material to be etched. In the example of FIG. 1, prior to etching the material 101, a mask build-up material 111 is directionally deposited on the hard mask 105 to increase the aspect ratios of the patterned features of the hard mask 105. See operation 40. This allows the subsequent etch to proceed for a longer time providing deeper etching. The material 101 is then etched. See operation 50. In the example of FIG. 1, the mask build-up material 111 is completely removed during the etching. In some embodiments, however, some of it may remain. At operation 50, if the etch is complete, the hard mask 50 may be removed by an appropriate process. In some embodiments, however, an on-pattern directional deposition of a mask build-up material may be performed after 50 to increase the aspect ratios of the patterned features of the hard mask before continuing the etch process. Eroded mask material can be restored with the same or similar material or a different material and to the same or a different profile as needed.

Figure 2:
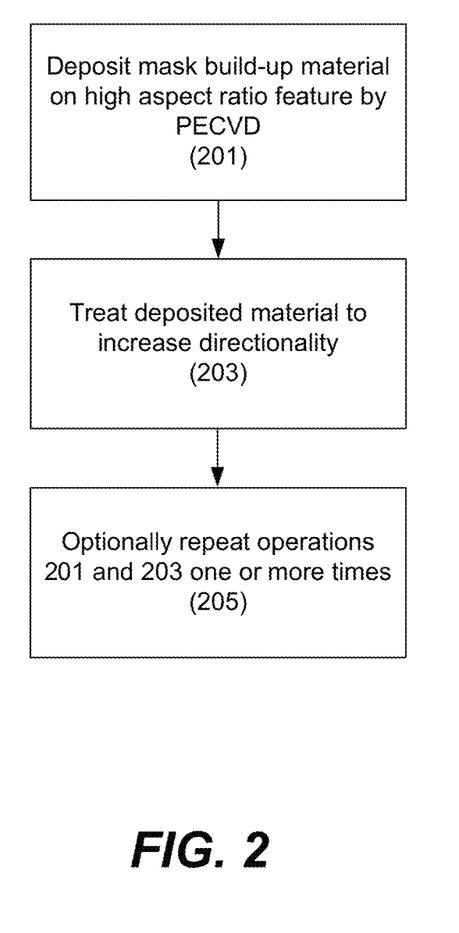
FIG. 2 shows certain operations in an example of a method of directional deposition on a high aspect ratio feature.

FIG. 2 shows certain operations in a method of directional deposition on a high aspect ratio feature. As described above, directional deposition may take place in an etch chamber prior to or in the midst of an etch process to increase the aspect ratio of a mask overlying material to be etched.

In FIG. 2, mask build-up material is deposited on the high aspect ratio features by a plasma-enhanced chemical vapor deposition (PECVD) process. Block 201. The mask build-up material is generally different than the mask material, can be deposited by PECVD, and has at least some etch selectivity to the material to be etched. As such, the mask build-up material will depend on the material to be etch and the etch chemistry to be used. Typically, the mask build up material is a dielectric material. Examples include silicon-containing films and carbon-containing films and the combination thereof.

To facilitate directional deposition, in some embodiments, deposition chemistries may include molecules having high sticking coefficients and low mobilities. Sticking coefficient is the ratio of the number of adsorbate molecules that stick to a surface to the total number of molecules that impinge on the surface during the same period of time. Sticking coefficients depend on size (with large molecules having higher sticking coefficients) and proclivity for adsorption on the surface.

Mobility refers to the surface and gas diffusion rates of the molecules. In some embodiments, deposition chemistries that include polymeric chains may be used. Such chains may form in the plasma during the PECVD process. For example, a chlorosilane with hydrogen ($H_2$) may be introduced to the chamber. A plasma may be struck, generating radicals (denoted with a *) and ions, with subsequent reactions producing chlorinated polysilanes.

Examples plasma reactions include:

$H_2 + e^- \rightarrow 2H^* + e^-$ $SiCl_4 + e^- \rightarrow SiCl_3^* + Cl^* + e^-$ $SiCl_4 + H^* \rightarrow SiCl_3^* + HCl$ $SiCl_4 + 2H^* \rightarrow HSiCl_3 + HCl$ $SiCl_3^* + 2H^* \rightarrow SiCl_2^* + HCl + H^*$, or $\rightarrow HSiCl_2^* + Cl^* + H^*$, or $\rightarrow HSiCl_3 + H^*$, or $\rightarrow H_2SiCl^* + 2Cl^*$, $n(SiCl_2^*) + mSiCl_3^* \rightarrow Si_2Cl_6 + \ldots \rightarrow Si_3Cl_8 + \ldots \rightarrow Si_nCl_{2n+2}$ $n(HSiCl^*) + mH_2SiCl^* \rightarrow H_2Si_2Cl_4 + \rightarrow H_xSi_nCl_{2n+2-x}$ Similar reactions taking place also on a surface make the deposition process more complicated.

Figure 3A:
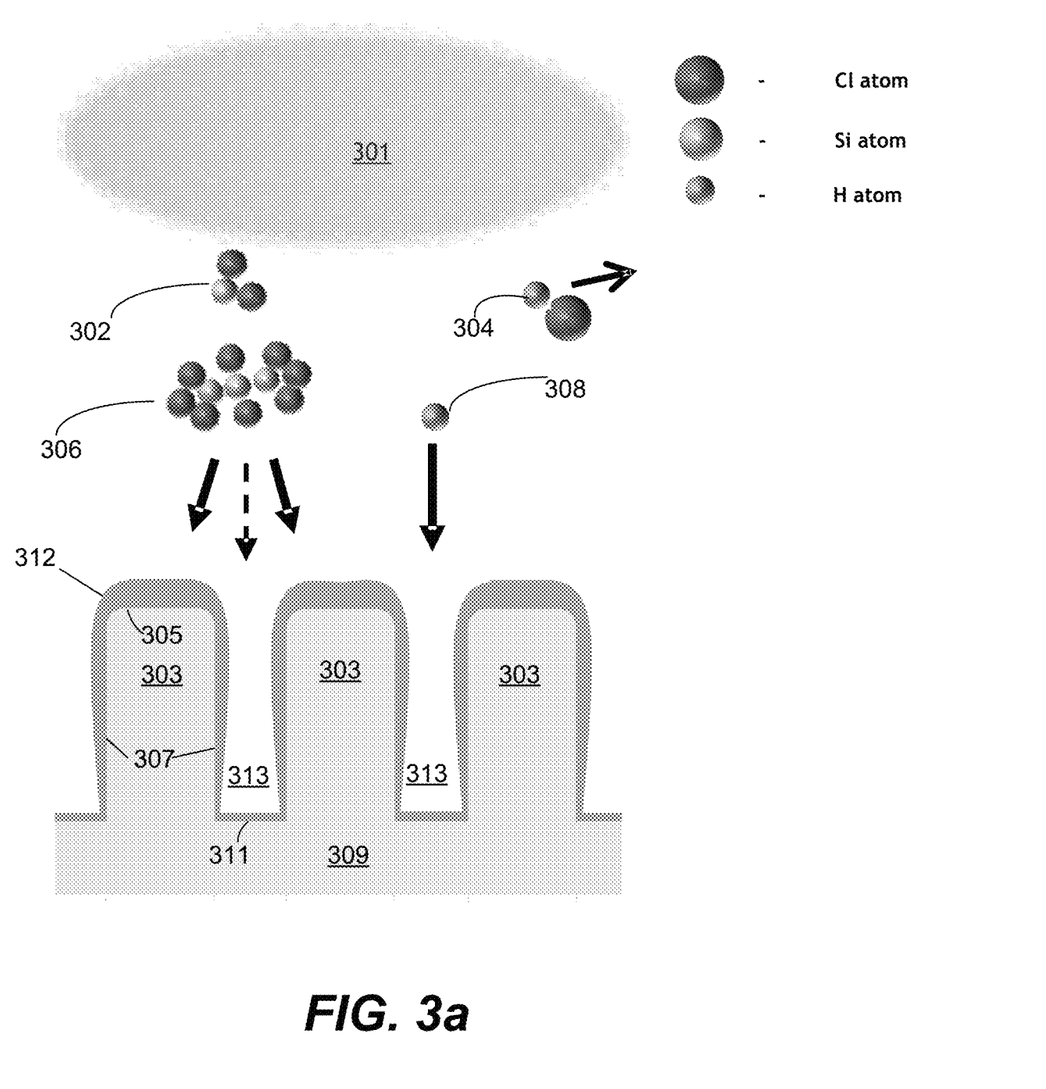
FIGS. 3a-3d show schematic examples of three high aspect ratio patterned hard mask features during a directional deposition process.

Chlorinated polysilanes may be large clusters. Both, chlorosilanes and chlorinated polysilanes, have high sticking coefficients and low mobilities that help in providing on-pattern direction deposition. Other example deposition chemistries are discussed further below. After block 201, the mask build-up material deposited on the high aspect ratio feature may be directionally deposited, with deposited material thicker at the top of the feature than along the sidewalls and at the feature bottom. FIG. 3a shows a schematic example of high aspect ratio patterned hard mask features after block 201. In the example of FIG. 3a, patterned hard mask features are 303 are shown overlying a material 309 to be etched. The patterned hard mask features 303 may be characterized as having feature tops 305 and sidewalls 307. The patterned hard mask features 303 form high aspect ratio holes 313, which may be for example, contact holes or trenches. The bottoms 311 of the holes 313 may be referred to as the feature bottoms.

In some embodiments, a bias voltage is applied to the wafer during PECVD deposition. This may increase the sticking coefficient of various species in the plasma. For example, a bias voltage may increase the sticking coefficient of chlorosilane ion radicals.

A plasma 301 generated in a gaseous mixture from a silicon-containing precursor and diluting gases is used to deposit a silicon film on the hard mask. Example plasma species include $SiH_yCl_x$* radicals 302, H* atoms 308, and chlorinated polysilanes 306. Hydrogen chloride (HCl) species 304 are generated as a byproduct. The silicon-containing species deposit a silicon build up material 312 on the patterned hard mask features 303. In the example of FIG. 3a, the deposition is directional in that more build-up material 312 is deposited on the feature tops 305 than on the sidewalls 307 and the bottoms 311. The thickness of the build-up material 312 decreases with the depth of the feature.

Returning to FIG. 2, the deposited mask build-up material is then treated to increase directionality. Block 203. Increasing directionality may increase the aspect ratio of the mask build-up material. In some embodiments, the mask build-up material is no more than a few nanometers thick on the sidewalls of the patterned hard mask. Directionality may also be characterized in terms of top:bottom step coverage or top:sidewall step coverage. In FIG. 3d, for example, 320 indicates a top thickness, 322 indicates a bottom thickness, and 324 indicates a sidewall thickness. Step coverage is the ratio of two thicknesses, e.g., top:bottom step coverage or top:sidewall step coverage. In measuring sidewall thickness, a thickness at the mid-point of the feature depth may be used. In some embodiments, the treatment operation increases top:bottom or top:sidewall step coverage. In some embodiments, block 203 also modifies a material property (e.g., density, chemical composition, or etch resistivity) of the deposited material.

Operation 203 can involve exposing the mask build-up material to plasma species that have high mobility and that can etch the mask build-up material. The plasma species may chemically etch the mask build-up material selectively with respect to the material to be etched and/or with respect to that hard mask. In some embodiments, the reaction products of the chemical etch are re-deposited as build-up material on the upper part of the patterned hard mask features.

In some embodiments, a hydrogen-based plasma is used. A hydrogen-based plasma is a plasma in which hydrogen species, primarily H radicals, are the predominant treatment species and may be the predominant etching species in some embodiments. In some embodiments, an hydrogen-based plasma may be formed from a gas that consists essentially of $H_2$. In some embodiments, one or more inert gases may be present along with $H_2$. A hydrogen-based plasma that can selectively etch silicon without etching oxides.

In some embodiments, a plasma generating gas including one or more of the following is introduced to a plasma generator to generate a plasma species. In some embodiments, the plasma generating gas includes one or more hydrogen-containing plasmas. Examples of such gases include $H_2$, $CH_4$, $NH_3$, $C_2H_2$, and $N_2H_2$. The resulting plasma may be a hydrogen-based plasma.

In some embodiments, a nitrogen-based plasma, an oxygen-based plasma, a hydrocarbon-based plasma, an argon-based plasma, or a helium-based plasma may be used. In a nitrogen-based plasma, the predominant treatment species is nitrogen, in an oxygen-based plasma, the predominant treatment species is oxygen, etc. In some embodiments, these may be predominant etching species for treatments that involve etching.

Figure 3B:
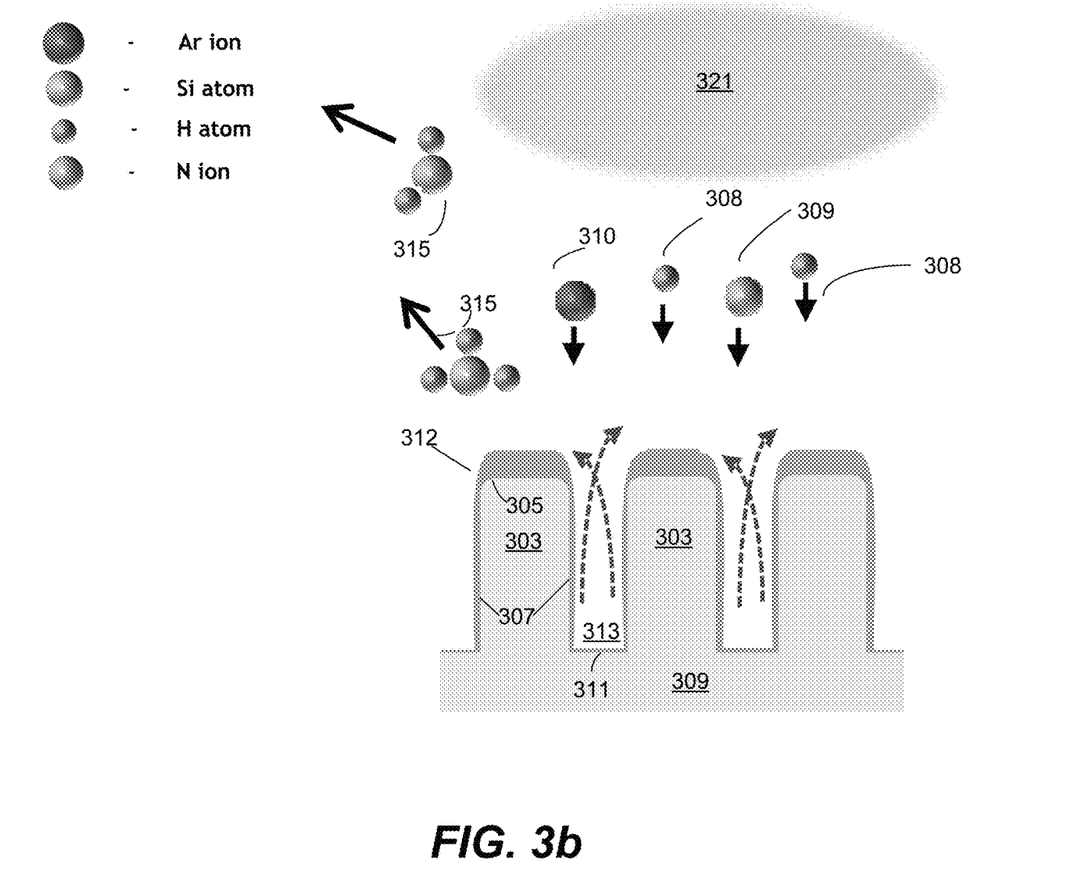

FIG. 3b shows a schematic example of high aspect ratio patterned hard mask features after block 203. A treating plasma 321 may include one or more of Ar ions, Si ions, H* atoms, N ions, and Cl* atoms, for example. Ultraviolet light, either generated from the plasma or from a separate UV source, may be in the chamber as well.

Figure 3C:
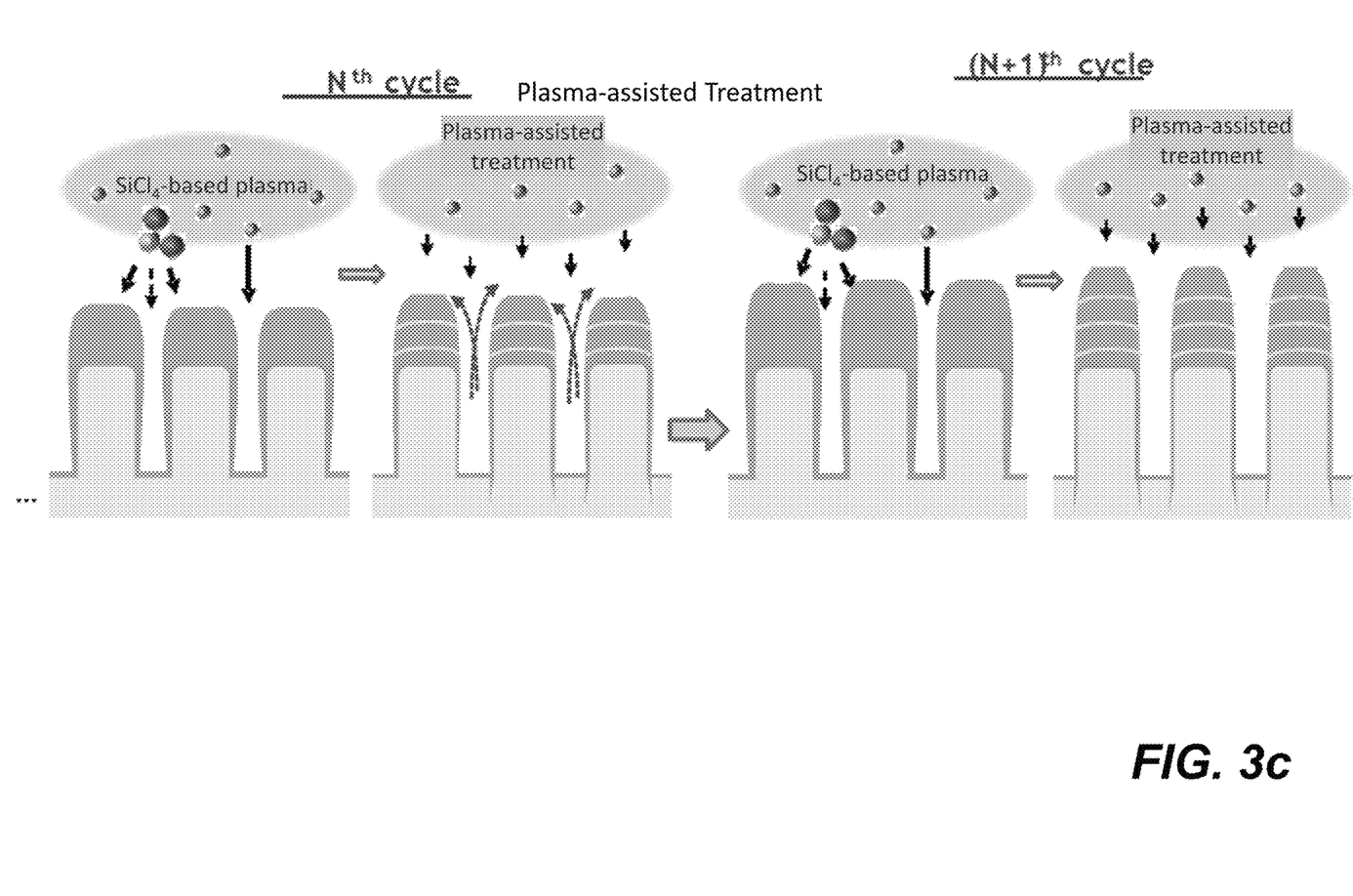
Figure 3D:
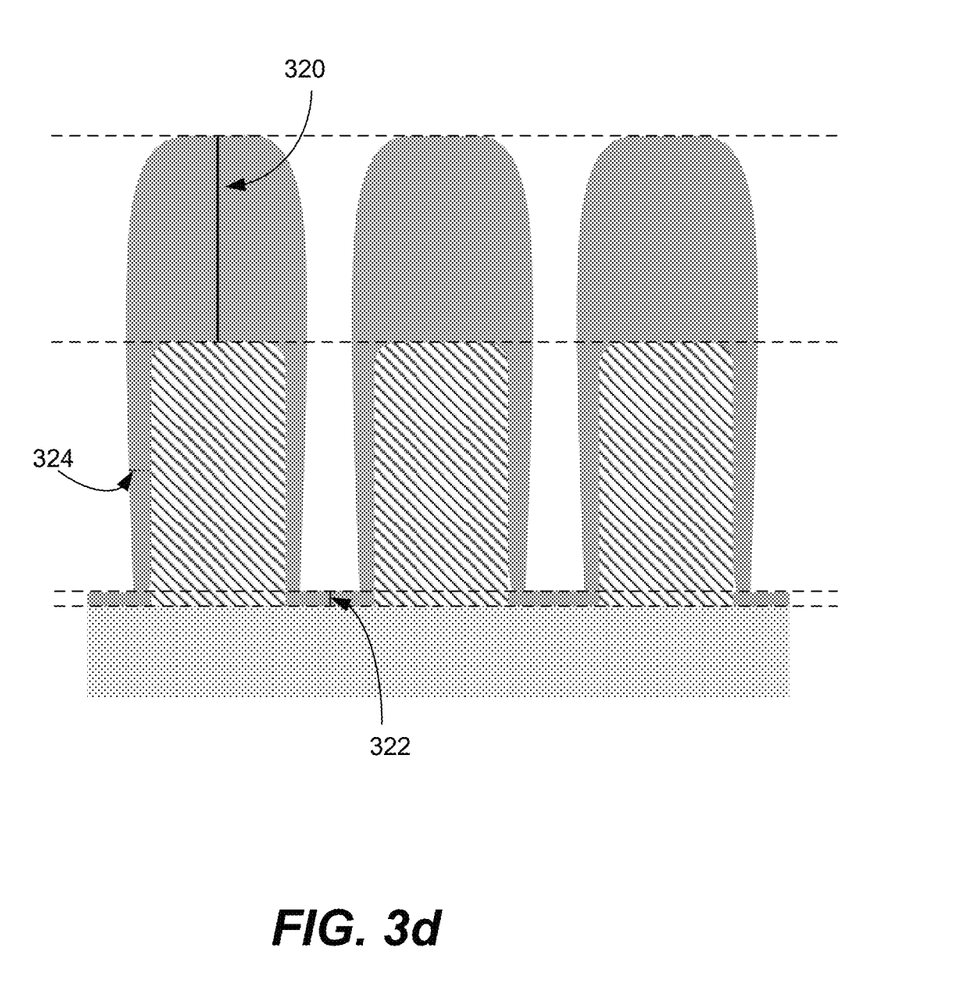

In FIG. 3b, the treatment plasma includes H* atoms 308, N ions 309, and Ar ions 310. These may travel deep into the holes 313 and etch build-up material 312 from the sidewalls 307 and bottoms 311 of the features. Some of the etched build-up material may re-deposit at the tops 305 of the features. Various product species 315 may form and lead to re-deposition or leave as a byproduct. Examples of product species can include $SiCl_xH_y$ species, $Si_xH_y$, and $N_xH_y$ species. In this manner, directionality of the mask build-up material to the top of the patterned hard mask features over the sidewalls and bottoms is improved. Returning to FIG. 2, blocks 201 and 203 may be repeated one or more times to attain the desired aspect ratio. Block 201 may be performed only long enough to deposit no more than a thin layer of mask build-up material on the sidewalls and bottoms of the features such that it can be removed in block 203. Example top thicknesses per cycle may range from 10 Å to 500 Å, or 10 Å to 100 Å. FIG. 3c shows a schematic example of the patterned hard mask and the mask build-up material in an Nth and (N+1)th cycles.

Figure 4:
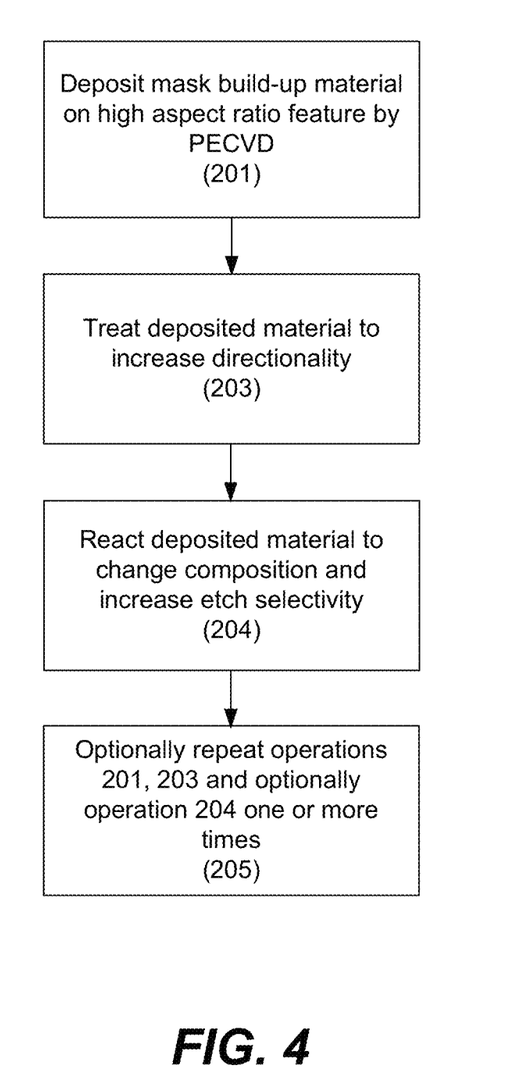
FIG. 4 shows certain operations in an example of a method of directional deposition on a high aspect ratio feature.

FIG. 4 shows certain operations in a method of directional deposition on a high aspect ratio feature. As described above, directional deposition may take place in an etch chamber prior to or in the midst of an etch process to increase the aspect ratio of a mask overlying material to be etched. The process described in FIG. 4 is similar to that described with respect to FIG. 2, with operations 201 and 203 performed as described above. However, in the example of FIG. 4, after treating the deposited material to increase pattern selectivity, the mask build-up material may be reacted to increase etch selectivity. See block 204. In one example, a silicon mask build-up material may be exposed to a carbon-containing gas to form a silicon carbide. This can be particularly useful to form the mask build-up material with high etch selectivity to oxides. In other example, a silicon mask build-up material may be exposed to a nitrogen-containing gas to form a silicon nitride.

In some embodiments, operation 204 in FIG. 4 may be performed prior to operation 203 such that the mask build-up material is reacted to form another material prior to the treatment process. In some embodiments, operation 204 may be performed only after multiple cycles of operations 203 and 204. For example, operation 204 may be performed after operation 205.

In some embodiments, an optional densification operation may be performed after operation 203 in FIG. 2 or operation 204 in FIG. 4. If performed, the densification operation may involve a thermal anneal, exposure to ultraviolet radiation, or a plasma densification treatment, for example. In some embodiments, an optional densification operation may be performed after operation 205 in FIG. 2 or FIG. 4. In some embodiments, operations 203 and 204 may be performed simultaneously using an appropriate chemistry.

During deposition and treatment, the process conditions are tuned to provide non-conformal deposition without pinch-off. Pinch-off refers to adjacent features growing together to pinch-off the area between the features. As discussed further below with respect to experimental results, various process conditions may be tuned to provide directional deposition during the PECVD deposition and improved directionality and vertical sidewalls during the treatment operation. Cycling (rather than continuous PECVD) and the use of a treatment operation have been shown to facilitate in some embodiments, well-defined, high aspect ratio build-up material features. Bias voltage during PECVD deposition may also increase non-conformality and reduce pinch-off. Residence time (flow rates) and plasma power during deposition also affect non-conformality and pinch-off. The addition of additive gases during the treatment operation can help prevent etching of the previously deposited material at the tops of the features. Plasma power and exposure time during the treatment can also be tuned to limit etching to the hard mask walls and bottom.

While the above discussion focuses on depositing a silicon-based mask build-up material, other materials such as carbon films may be used. In depositing silicon, any appropriate silicon-containing precursor may be used including silanes (e.g., $SiH_4$), polysilanes ($H_3Si—(SiH_2)_n—SiH_3$) where n≥1, organosilanes, halogenated silanes, and aminosilanes. Organosilanes such as methylsilane, ethylsilane, isopropylsilane, t-butylsilane, dimethylsilane, diethyl silane, di-t-butylsilane, allylsilane, sec-butyl silane, thexylsilane, isoamylsilane, t-butyldisilane, di-t-butyldisilane, and the like, may be used. A halogenated silane contains at least one halogen group and may or may not contain hydrogens and/or carbon groups. Examples of halogenated silanes are iodosilanes, bromosilanes, chlorosilanes and fluorosilanes. Specific chlorosilanes are tetrachlorosilane ($SiCl_4$), trichlorosilane ($HSiCl_3$), dichlorosilane ($H_2SiCl_2$), monochlorosilane ($ClSiH_3$), chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butyl silane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)—(N(CH_3)_2)_2$, $SiHCl—(N(CH_3)_2)_2$, $(Si(CH_3)_2NH)_3$ and the like.

The deposited films are generally amorphous, with film composition will depend on the particular precursor and co-reactants used, with organosilanes resulting a-SiC:H films and aminosilanes will result in a-SiN:H or a-SiCN:H films.

In depositing carbon films, any appropriate carbon-containing precursor may be used. In some embodiments, a hydrocarbon precursor of the formula $C_xH_y$, wherein X is an integer between 2 and 10, and Y is an integer between 2 and 24, may be used. Examples include methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$).

In some embodiments, the build-up material may be doped or include a material such as boron or phosphorous. Additional dopants include arsenic, sulfur and selenium. In this manner, etch selectivity to an underlying film may be improved. For example, for doped dielectrics (particularly silicon dioxide based dielectrics), the process gas may include a dopant precursor such as a boron-containing gas, a phosphorus-containing gas, a carbon-containing gas, or a mixture thereof. In a specific embodiment, the gas includes one or more boron-containing reactants and one or more phosphorus-containing reactants and the dielectric film includes a phosphorus- and boron-doped silicon oxide glass (BPSG). Examples of suitable boron and phosphorus precursor gases include borane ($BH_3$), diborane ($B_2H_6$), and triborane ($B_3H_7$) and phosphine ($PH_3$). Examples of arsenic-containing, sulfur-containing, and selenium-containing gases include hydrogen selenide ($H_2Se$), hydrogen arsenide ($AsH_3$), and hydrogen sulfide ($H_2S$).

If the dielectric is to contain an oxynitride (e.g., silicon oxynitride), then the deposition gas may include a nitrogen-containing reactant such as $N_2$, $NH_3$, NO, $N_2O$, and mixtures thereof. Examples of deposited films include boron-doped silicon, silicon boride, silicon boride carbon, and the like.

Metal-containing films may also be deposited. Examples of metal-containing films that may be formed include oxides and nitrides of aluminum, titanium, hafnium, tantalum, tungsten, manganese, magnesium, strontium, etc., as well as elemental metal films. Example precursors may include metal alkylamines, metal alkoxides, metal alkylamides, metal halides, metal ß-diketonates, metal carbonyls, organometallics, etc. Appropriate metal-containing precursors will include the metal that is desired to be incorporated into the film. For example, a tantalum-containing layer may be deposited by reacting pentakis(dimethylamido)tantalum with ammonia or another reducing agent as an auxiliary reactant. Further examples of metal-containing precursors that may be employed include trimethylaluminum, tetraethoxytitanium, tetrakis-dimethyl-amido titanium, hafnium tetrakis(ethylmethylamide), bis(cyclopentadienyl)manganese, and bis(n-propylcyclopentadienyl)magnesium, etc.

In addition to hydrogen, examples of treatment chemistries include nitrogen-containing, oxygen-containing, carbon-containing, and halogen-containing treatment chemistries as well as noble gases.

In some embodiments, blocks 203 and 204 may be combined. For example, an operation may include exposing the deposited material to a hydrogen-containing compound such as $CH_4$, $NH_3$, $H_2Se$, $H_2S$, $AsH_3$, or $PH_3$ to simultaneously treat and react the deposited material.

Apparatus

In some embodiments, the directional deposition is performed in an etching apparatus. For example, the methods described above may be performed in an inductively-coupled plasma etching apparatus or a capacitively-coupled plasma etching apparatus.

Figure 5:
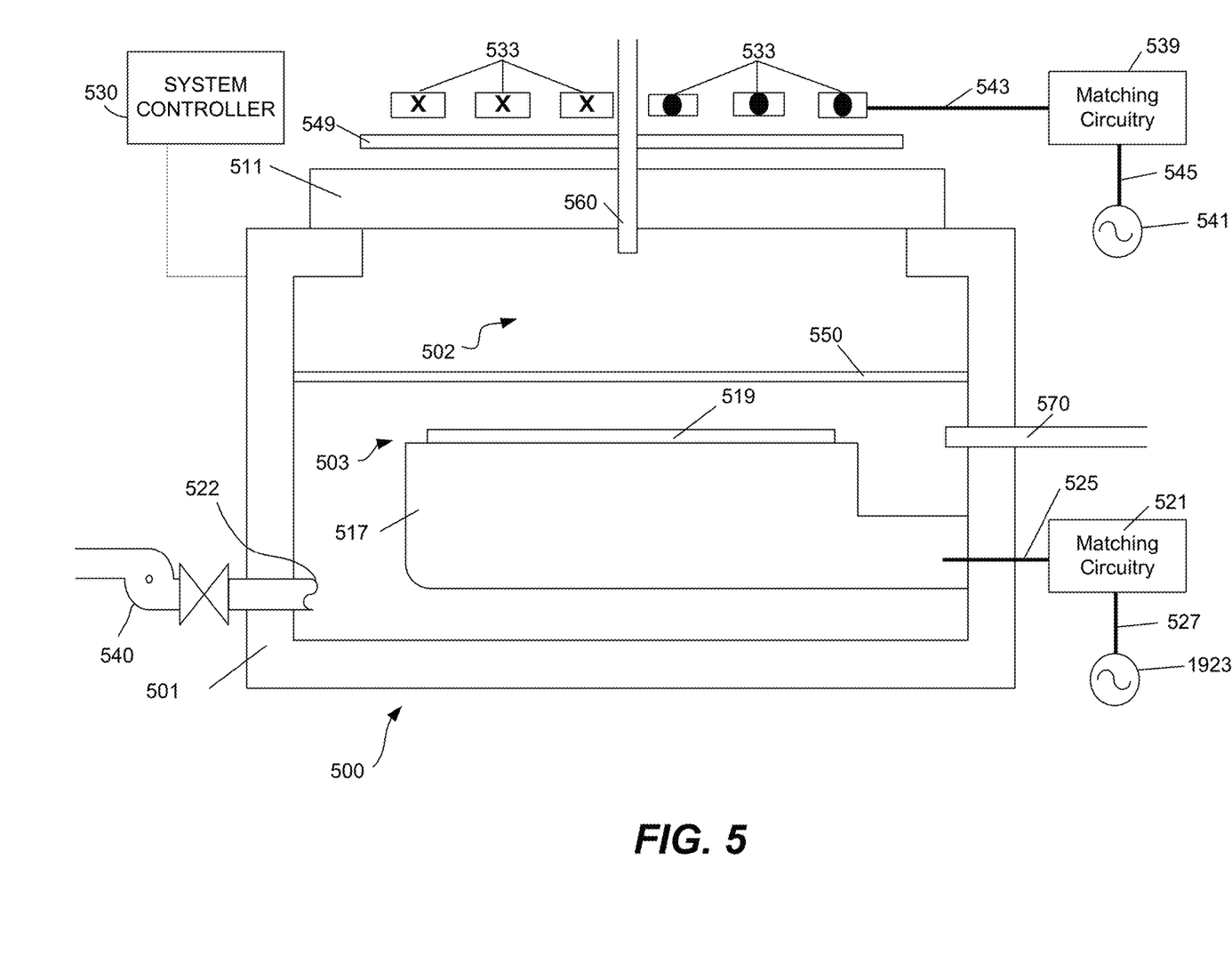
FIGS. 5 and 6 are schematic diagrams of examples of process chambers for performing methods in accordance with disclosed embodiments.

FIG. 5 schematically shows a cross-sectional view of an inductively coupled plasma etching apparatus 500 in accordance with certain embodiments herein. A Kiyo™ reactor, produced by Lam Research Corp. of Fremont, Calif., is an example of a suitable reactor that may be used to implement the techniques described herein. The inductively coupled plasma etching apparatus 500 includes an overall etching chamber structurally defined by chamber walls 501 and a window 511. The chamber walls 501 may be fabricated from stainless steel or aluminum. The window 511 may be fabricated from quartz or other dielectric material. An optional internal plasma grid 550 divides the overall etching chamber into an upper sub-chamber 502 and a lower sub-chamber 503. In most embodiments, plasma grid 550 may be removed, thereby utilizing a chamber space made of sub-chambers 502 and 503. A chuck 517 is positioned within the lower sub-chamber 503 near the bottom inner surface. The chuck 517 is configured to receive and hold a semiconductor wafer 519 upon which the etching process is performed. The chuck 517 can be an electrostatic chuck for supporting the wafer 519 when present. In some embodiments, an edge ring (not shown) surrounds chuck 517, and has an upper surface that is approximately planar with a top surface of a wafer 519, when present over chuck 517. The chuck 517 also includes electrostatic electrodes for chucking and dechucking the wafer. A filter and DC clamp power supply (not shown) may be provided for this purpose. Other control systems for lifting the wafer 519 off the chuck 517 can also be provided. The chuck 517 can be electrically charged using an RF power supply 523. The RF power supply 523 is connected to matching circuitry 521 through a connection 527. The matching circuitry 521 is connected to the chuck 517 through a connection 525. In this manner, the RF power supply 523 is connected to the chuck 517.

A coil 533 is positioned above window 511. The coil 533 is fabricated from an electrically conductive material and includes at least one complete turn. The exemplary coil 533 shown in FIG. 5 includes three turns. The cross-sections of coil 533 are shown with symbols, and coils having an "X" extend rotationally into the page, while coils having a "●" extend rotationally out of the page. An RF power supply 541 is configured to supply RF power to the coil 533. In general, the RF power supply 541 is connected to matching circuitry 539 through a connection 545. The matching circuitry 539 is connected to the coil 533 through a connection 543. In this manner, the RF power supply 541 is connected to the coil 533. An optional Faraday shield 549 is positioned between the coil 533 and the window 511. The Faraday shield 549 is maintained in a spaced apart relationship relative to the coil 533. The Faraday shield 549 is disposed immediately above the window 511. The coil 533, the Faraday shield 549, and the window 511 are each configured to be substantially parallel to one another. The Faraday shield may prevent metal or other species from depositing on the dielectric window of the plasma chamber.

Process gases may be supplied through a main injection port 560 positioned in the upper chamber and/or through a side injection port 570, sometimes referred to as an STG. A vacuum pump, e.g., a one or two stage mechanical dry pump and/or turbomolecular pump 540, may be used to draw process gases out of the process chamber 524 and to maintain a pressure within the process chamber 500 by using a closed-loop-controlled flow restriction device, such as a throttle valve (not shown) or a pendulum valve (not shown), during operational plasma processing.

During operation of the apparatus, one or more reactant gases may be supplied through injection ports 560 and/or 570. In certain embodiments, gas may be supplied only through the main injection port 560, or only through the side injection port 570. In some cases, the injection ports may be replaced by showerheads. The Faraday shield 549 and/or optional grid 550 may include internal channels and holes that allow delivery of process gases to the chamber. Either or both of Faraday shield 549 and optional grid 550 may serve as a showerhead for delivery of process gases.

Radio frequency power is supplied from the RF power supply 541 to the coil 533 to cause an RF current to flow through the coil 533. The RF current flowing through the coil 533 generates an electromagnetic field about the coil 533. The electromagnetic field generates an inductive current within the upper sub-chamber 502. During an etch process, the physical and chemical interactions of various generated ions and radicals with the wafer 519 selectively etch features of the wafer.

If the plasma grid is used such that there is both an upper sub-chamber 502 and a lower sub-chamber 503, the inductive current acts on the gas present in the upper sub-chamber 502 to generate an electron-ion plasma in the upper sub-chamber 502. The optional internal plasma grid 550 limits the amount of hot electrons in the lower sub-chamber 503. In some embodiments, the apparatus is designed and operated such that the plasma present in the lower sub-chamber 503 is an ion-ion plasma.

Both the upper electron-ion plasma and the lower ion-ion plasma may contain positive and negative ions, through the ion-ion plasma will have a greater ratio of negative ions to positive ions. Volatile etching byproducts may be removed from the lower-subchamber 503 through port 522.

The chuck 517 disclosed herein may operate at elevated temperatures ranging between about 30° C. and about 250° C. The temperature will depend on the etching process operation and specific recipe. In some embodiments, the chamber 501 may also operate at pressures in the range of between about 1 mTorr and about 95 mTorr. In certain embodiments, the pressure may be higher as disclosed above.

Chamber 501 may be coupled to facilities (not shown) when installed in a clean room or a fabrication facility. Facilities include plumbing that provide processing gases, vacuum, temperature control, and environmental particle control. These facilities are coupled to chamber 501, when installed in the target fabrication facility. Additionally, chamber 501 may be coupled to a transfer chamber that allows robotics to transfer semiconductor wafers into and out of chamber 501 using typical automation.

In some embodiments, a system controller 530 (which may include one or more physical or logical controllers) controls some or all of the operations of an etching chamber. Controllers are described further below.

Figure 6:
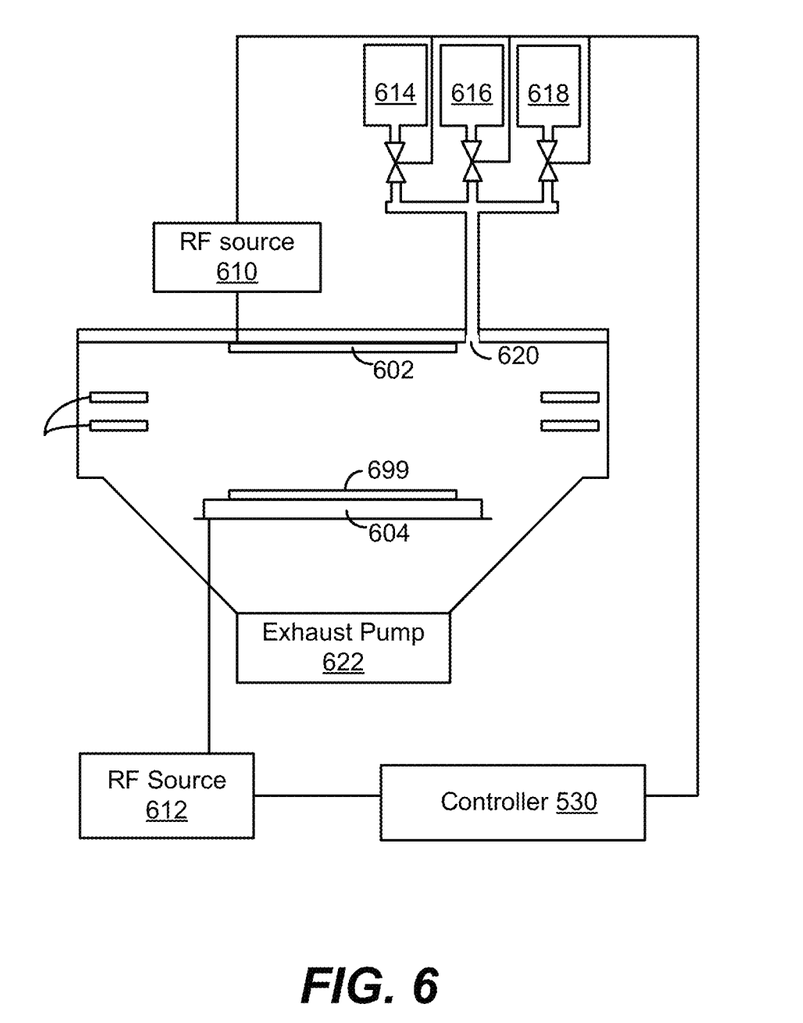

FIG. 6 is a schematic depiction of an example of a capacitively-coupled plasma etching apparatus according to various embodiments. A plasma etch chamber 600 includes an upper electrode 602 and a lower electrode 604 between which a plasma may be generated. A substrate 699 having a patterned hard mask film thereon and as described above may be positioned on the lower electrode 604 and may be held in place by an electrostatic chuck (ESC). Other clamping mechanisms may also be employed. The plasma etch chamber 600 may include plasma confinement rings 606 that keep the plasma over the substrate and away from the chamber walls. Other plasma confinement structures, e.g. as a shroud that acts an inner wall, may be employed. In some embodiments, the plasma etch chamber may not include any such plasma confinement structures.

In the example of FIG. 6, the plasma etch chamber 600 includes two RF sources with RF source 610 connected to the upper electrode 602 and RF source 612 connected to the lower electrode 604. Each of the RF sources 610 and 612 may include one or more sources of any appropriate frequency including 2 MHz, 13.56 MHz, 27 MHz, and 60 MHz. Gas may be introduced to the chamber from one or more gas sources 614, 416, and 418. For example, the gas source 614 may include deposition or etching gases as described above. Gas may be introduced to the chamber through inlet 620 with excess gas and reaction byproducts exhausted via exhaust pump 622.

One example of a plasma etch chamber that may be employed is a 2300® Flex™ reactive ion etch tool available from Lam Research Corp. of Fremont, Calif. Further description of plasma etch chambers may be found in U.S. Pat. Nos. 6,841,943 and 8,552,334, which are herein incorporated by reference for all purposes.

Returning to FIG. 6, a controller 530 may be connected to the RF sources 610 and 612 as well as to valves associated with the gas sources 614, 616, and 618, and to the exhaust pump 622. In some embodiments, the controller 530 controls all of the activities of the plasma etch chamber 600.

The following discussion of a controller 530 may be applied as appropriate to the controller 530 in FIGS. 5 and 6. The controller 530 may execute control software stored in mass storage device, loaded into a memory device, and executed on a processor. Alternatively, the control logic may be hard coded in the controller 530. Alternatively, the control logic may be hard coded in the controller 530. Applications Specific Integrated Circuits, Programmable Logic Devices (e.g., field-programmable gate arrays, or FPGAs) and the like may be used for these purposes. In the following discussion as well as in the discussion of the controller in FIG. 6, wherever "software" or "code" is used, functionally comparable hard coded logic may be used in its place.

The control software may include instructions for controlling the timing of application and/or magnitude of any one or more of the following chamber operational conditions: the mixture and/or composition of gases, chamber pressure, chamber temperature, wafer/wafer support temperature, the bias applied to the wafer, the frequency and power applied to coils or other plasma generation components, wafer position, wafer movement speed, and other parameters of a particular process performed by the tool. Control software may be configured in any suitable way. For example, various process tool component subroutines or control objects may be written to control operations of the process tool components necessary to carry out various process tool processes. Control software may be coded in any suitable compute readable programming language.

In some embodiments, the control software may include input/output control (IOC) sequencing instructions for controlling the various parameters described above. Other computer software and/or programs stored on mass storage device and/or memory device associated with the controller 530 may be employed in some embodiments. Examples of programs or sections of programs for this purpose include a process gas control program, a pressure control program, and RF source control programs.

A process gas control program may include code for controlling gas composition (e.g., deposition and treatment gases as described herein) and flow rates and optionally for flowing gas into a chamber prior to deposition to stabilize the pressure in the chamber. A pressure control program may include code for controlling the pressure in the chamber by regulating, for example, a throttle valve in the exhaust system of the chamber, a gas flow into the chamber, etc. A RF source control program may include code for setting RF power levels applied to the electrodes in accordance with the embodiments herein.

In some embodiments, there may be a user interface associated with the controller 530. The user interface may include a display screen, graphical software displays of the apparatus and/or process conditions, and user input devices such as pointing devices, keyboards, touch screens, microphones, etc.

In some embodiments, parameters adjusted by controller 530 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 530 from various process tool sensors. The signals for controlling the process may be output on the analog and digital output connections of the plasma etch chamber. Non-limiting examples of sensors that may be monitored include mass flow controllers, pressure sensors (such as manometers), thermocouples, etc. Appropriately programmed feedback and control algorithms may be used with data from these sensors to maintain process conditions.

The controller 530 may provide program instructions for implementing the above-described directional deposition processes as well as subsequent etch processes. The program instructions may control a variety of process parameters, such as RF bias power level, pressure, temperature, etc. The instructions may control the parameters to directionally deposit mask-build up films according to various embodiments described herein.

A controller 530 will typically include one or more memory devices and one or more processors configured to execute the instructions so that the apparatus will perform a method in accordance with disclosed embodiments. Machine-readable media including instructions for controlling process operations in accordance with disclosed embodiments may be coupled to the controller 530, for example as describe above.

In some implementations, the controller 530 may be or form part of a system controller that is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller, in some implementations, may be a part of or coupled to a computer that is integrated with, coupled to the system, otherwise networked to the system, or a combination thereof. For example, the system controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller receives instructions in the form of data, which specify parameters for each of the processing steps to be performed during one or more operations. It should be understood that the parameters may be specific to the type of process to be performed and the type of tool that the system controller is configured to interface with or control. Thus as described above, the system controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In some embodiments, the PECVD deposition may employ a remote, radical-assisted plasma or a microwave plasma. Such a deposition may be performed in an etch chamber configured with a remote or microwave plasma generator or may be performed in a deposition chamber connected under vacuum to an etch chamber. Similarly, in some embodiments, a treatment operation may be performed using a remote radical-assisted plasma or a microwave plasma.

Example process parameters are given as follows. Example pressure ranges are from 5 mT to 1000 mT, and in some embodiments, between 40 mT to 100 mT. In a treatment operation, example pressures may range from 5 mT to 300 mT.

Example plasma powers for an inductively coupled plasma source (e.g., a transformer coupled plasma (TCP) source available from Lam Research, Fremont Calif. is 10 W to 1200 W, 20 W to 500 W, or 50 W to 300 W. Example plasma powers for a deposition operation range from 20 W to 200 W. Example plasma powers for a treatment operation range from 20 W to 1200 W.

Example bias voltages range from 0 V to −500 V, 0 to −80 V, for example −50 V. Bias voltage may also be expressed in terms of magnitude, e.g., 0 to 500 V, 0 to 80 V, or 0 to 50 V. Example flow rates at the deposition step range from 1 sccm to 2000 sccm, from 1 to 300 sccm, or 100 sccm. Example flow rates at the treatment step range from 1 to 2000 sccm, 1 to 500 sccm, or 300 sccm. Example substrate temperatures range from 40° C. to 250° or 60° C. to 120° C. Deposition and treatment exposure time may range from 0.5 s to 20 s in some embodiments, or from 3 s to 10 s, or 4 s to 6 s, with an example of a process time for the multi-cycle process. In some examples, between 10 and 100 cycles are performed.

EXPERIMENTAL

The following examples are provided to further illustrate aspects of various embodiments. These examples are provided to exemplify and more clearly illustrate aspects and are not intended to be limiting.

An inductively coupled etch reactor was used to deposit a-Si build-materials on hard masks for continuous and cyclic deposition, with and without treatment. The deposition process gas was $SiCl_4/H_2$ with an $H_2$-based plasma as the treatment step. Pressure was varied between 20 mT and 120 mT.

For continuous PECVD, build-up materials were deposited at 60 seconds (s) and 120 s at 40 mT and 75 s for 60 mT. Pinch-off of the mask build-up materials was observed at 120 s/40 mT and 75 s/40 mT. Deposition was non-conformal. For cyclic PECVD with no treatment, build-up materials were deposited at 20 cycles of 3 s (60 s) and 40 cycles of 3 s (120 s) at 40 mT and 25 cycles of 3 s (75 s) at 60 mT. Pinch-off was observed for the 60 mT case. Deposition was non-conformal. Comparison of the 120 s/40 mT results (no pinch-off) with the results for 120 s/40 mT of continuous CVD indicates that cycling facilitates well-defined high aspect ratio features. For cyclic PECVD with plasma treatment, build up materials were deposited at 20 cycles of 3 s deposition+5 s treatment and 40 cycles of 3 s deposition+5 s treatment at 40 mT and 25 cycles of 3 s deposition+5 s treatment at 60 mT. Deposition was non-conformal. No pinch off was observed, indicating that treatment facilitates deposition of high aspect ratio features over a wide pressure range.

An inductively coupled etch reactor was used to deposit a-Si build-up materials on $SiO_2$ hard masks using multiple deposition-treatment cycles. The deposition process gas was $SiCl_4/H_2$, plasma power was 50 W, and pressure was 60 mT. The treatment process gas was $H_2$ with a small amount (approximately 5 vol. %) of $N_2$, plasma power was 300 W and there was no bias voltage on the substrate. 25 deposition-treatment cycles were performed. Bias voltage was varied for deposition with the following results:

| Bias Voltage during PECVD deposition | Top Thickness | Top: Bottom Step Coverage | Top: Sidewall Step Coverage |
|---|---|---|---|
| 0 | 61 nm | 5 | 5 |
| 50 V | 109 nm | 9 | 22 |

An inductively coupled etch reactor was used to deposit a-Si build-up materials on hard masks using multiple deposition/treatment cycles. $SiCl_4/H_2$ flow rates were varied. Pinch-off was observed for longer residence time (lower flow rate). Without being bound by a particular theory, it is believed that longer SiCl species residence time leads to pinch-off. H radicals scavenge Cl in reactions in the plasma. H radicals and ions eliminate overhang and pinch-off, providing effective top mask etching and vertical sidewall profiles.

An inductively coupled etch reactor was used to deposit a-Si build-up materials on hard masks using multiple deposition/treatment cycles. Plasma power during the deposition step was varied. Higher non-conformality was achieved with higher power. Without being bound by a particular theory, it is believed that concentration of $SiCl_x$ radicals having a high sticking coefficient and the concentration of H radicals, which prevent overhang and pinch-off, are increased.

An inductively coupled etch reactor was used to deposit a-Si build-up materials on hard masks using multiple deposition/treatment cycles. Gas composition during the treatment step was varied. 100% $H_2$ used resulted in a profile that necked. Without being bound by a particular theory, it is believed that the $H_2$ plasma made the already deposited a-Si film less reactive, reducing the sticking coefficient. The deposited film was etched and re-deposited from the trench bottom to the top. More vertical profiles were observed with the addition of an additive gas (5 vol % $N_2$ or 5 vol % $CH_4$). Thicker deposition at the trench bottom is observed.

An inductively coupled etch reactor was used to deposit a-Si build-up materials on hard masks using multiple deposition/treatment cycles. Plasma power during the treatment step was varied. The treatment gas was 100% $H_2$. 0 W, 50 W, 100 W, 200 W and 300 W power were used. 300 W resulted in a necked profile. Reducing power resulted in more vertical sidewalls as well as thicker trench and sidewall deposition, while 0 W resulted in pinch-off.

An inductively coupled etch reactor was used to deposit Si-containing build-up materials on hard masks using multiple deposition/treatment cycles. Exposure time during the treatment step was varied. 1 s, 2 s, 3 s and 5 s were used. 5 s resulted in a necked profile. Reducing exposure time resulted in more vertical sidewalls as well as thicker trench and sidewall deposition.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

The invention claimed is:

1. A method comprising:
    depositing a material on a patterned structure in a multi-cycle deposition process, wherein the patterned structure comprises raised features having features tops, feature bottoms, and feature sidewalls connecting the feature tops and feature bottoms, and wherein in each cycle comprises (i) and (ii):
    i) depositing by plasma enhanced chemical vapor deposition (PECVD) process a first material non-conformally on the patterned structure such that a ratio of the thickness of the first material on a feature top to the thickness of the first material on a feature bottom is greater than 1 and ii) after depositing the first material, exposing the first material to a plasma capable of etching the first material;
    wherein the patterned structure is disposed on a first layer to be etched and the multi-cycle deposition process is performed without etching the first layer during or between the cycles.

2. The method of claim 1, wherein the first material is a silicon-based material, a carbon-based material, a boron-based material or a combination thereof.

3. The method of claim 1, wherein the first material comprises two or more of silicon, carbon, boron, phosphorous, arsenic and sulfur.

4. The method of claim 1, wherein (ii) comprises exposing the first material to an nitrogen-based plasma, an oxygen-based plasma, a hydrogen-based plasma, a hydrocarbon-based plasma, an argon-based plasma, a helium-based plasma, or a combination thereof.

5. The method of claim 1, wherein (ii) comprises exposing the first material to a plasma generated from a hydrogen-containing compound.

6. The method of claim 5, wherein the hydrogen-containing compound is one of $H_2$, $CH_4$, $NH_3$, $C_2H_2$, and $N_2H_2$.

7. The method of claim 1, wherein the first material is an amorphous silicon-containing film.

8. The method of claim 1, wherein the raised features comprise an organic hard mask.

9. The method of claim 1, wherein the raised features comprise an inorganic hard mask.

10. The method of claim 1, wherein (i) comprises forming polymeric chains during the PECVD process.

11. The method of claim 10, where the polymeric chains comprise chlorinated polysilanes.

12. The method of claim 1, wherein (i) comprises applying a bias voltage to a substrate including the patterned structure.

13. The method of claim 1, wherein (ii) comprises etching the first material from the feature bottoms.

14. The method of claim 13, wherein (ii) comprises re-depositing species resulting from the etch on the feature tops.

15. The method of claim 1, wherein depositing by the PECVD process comprises using a silicon-containing precursor selected from a silane, a halogenated silane, an organosilane, or an aminosilane to form a silicon-containing material.

16. The method of claim 1, wherein depositing by the PECVD process comprises introducing a carbon-containing precursor selected from methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$) to form a carbon-containing material.

17. The method of claim 1, wherein depositing by the PECVD process comprises using a metal-containing precursor to form a metal-containing material.

18. The method of claim 1, wherein the plasma in (ii) is a generated from a gas comprising hydrogen ($H_2$).

19. The method of claim 1, wherein (ii) comprises generating plasma species and chemically etching the first material with the plasma species.

20. The method of claim 1, wherein (ii) increases a ratio of the thickness of all material that is on the feature tops to the thickness of all material that is on the feature bottoms.

21. The method of claim 1, wherein depositing by plasma enhanced chemical vapor deposition (PECVD) process the first material comprises generating a plasma from a mixture of a silicon-containing precursor and hydrogen ($H_2$).

* * * * *